United States Patent
Grimbergen (10) Patent No.: US 10,453,696 B2
(45) Date of Patent: *Oct. 22, 2019

(54) DUAL ENDPOINT DETECTION FOR ADVANCED PHASE SHIFT AND BINARY PHOTOMASKS

(71) Applicant: Applied Materials, Inc., Santa Clara, CA (US)

(72) Inventor: Michael Grimbergen, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/726,233

(22) Filed: Oct. 5, 2017

(65) Prior Publication Data

US 2018/0047574 A1  Feb. 15, 2018

Related U.S. Application Data

(63) Continuation of application No. 13/774,006, filed on Feb. 22, 2013, now Pat. No. 9,805,939.

(Continued)

(51) Int. Cl.

| | |
|---|---|
| *H01L 21/3065* | (2006.01) |
| *H01J 37/32* | (2006.01) |
| *G03F 1/26* | (2012.01) |
| *G03F 1/80* | (2012.01) |
| *H01L 21/308* | (2006.01) |
| *H01L 21/66* | (2006.01) |

(52) U.S. Cl.
CPC ........... *H01L 21/3065* (2013.01); *G03F 1/26* (2013.01); *G03F 1/80* (2013.01); *H01J 37/32963* (2013.01); *H01L 21/3085* (2013.01); *H01L 22/12* (2013.01); *H01L 22/20* (2013.01)

(58) Field of Classification Search
CPC . H01L 21/3065; H01L 21/3085; H01L 22/20; H01L 22/12; G03F 1/80; G03F 1/26; H01J 37/32963

See application file for complete search history.

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |

(Continued)

FOREIGN PATENT DOCUMENTS

JP  2001085388 A  3/2001

OTHER PUBLICATIONS

PCT search report and written opinion of (PCT/US2013/053649) dated Dec. 24, 2013.

*Primary Examiner* — Duy Vu N Deo
(74) *Attorney, Agent, or Firm* — Patterson + Sheridan LLP (57) ABSTRACT

The present invention provides a method and apparatus for etching a photomask substrate with enhanced process monitoring, for example, by providing for optical monitoring at certain regions of the photomask to obtain dual endpoints, e.g., etch rate or thickness loss of both a photoresist layer and an absorber layer. By monitoring transmissity of an optical beam transmitted through areas having photoresist layer and etched absorber layer at two different predetermined wavelength, dual process endpoints may be obtained by a signal optical detection.

10 Claims, 5 Drawing Sheets

Related U.S. Application Data (60) Provisional application No. 61/749,156, filed on Jan. 4, 2013, provisional application No. 61/713,185, filed on Oct. 12, 2012.

(56) References Cited

U.S. PATENT DOCUMENTS

| | | |
|---|---|---|
| 4,413,022 A | 11/1983 | Suntola et al. |
| 4,834,831 A | 5/1989 | Nishizawa et al. |
| 4,993,357 A | 2/1991 | Scholz |
| 5,225,366 A | 7/1993 | Yoder |
| 5,281,274 A | 1/1994 | Yoder |
| 5,294,286 A | 3/1994 | Nishizawa et al. |
| 5,360,738 A | 11/1994 | Jones et al. |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,674,786 A | 10/1997 | Turner et al. |
| 5,711,811 A | 1/1998 | Suntola et al. |
| 5,796,116 A | 8/1998 | Nakata et al. |
| 5,807,792 A | 9/1998 | Ilg et al. |
| 5,835,677 A | 11/1998 | Li et al. |
| 5,855,680 A | 1/1999 | Soininen et al. |
| 5,866,795 A | 2/1999 | Wang et al. |
| 5,879,459 A | 3/1999 | Gadgil et al. |
| 5,916,365 A | 6/1999 | Sherman |
| 5,923,056 A | 7/1999 | Lee et al. |
| 6,015,590 A | 1/2000 | Suntola et al. |
| 6,015,917 A | 1/2000 | Bhandari et al. |
| 6,042,652 A | 3/2000 | Hyun et al. |
| 6,084,302 A | 7/2000 | Sandhu |
| 6,124,158 A | 9/2000 | Dautartas et al. |
| 6,139,700 A | 10/2000 | Kang et al. |
| 6,144,060 A | 11/2000 | Park et al. |
| 6,159,297 A | 12/2000 | Herchen et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,487 B1 | 3/2001 | Kim et al. |
| 6,228,277 B1 | 5/2001 | Kornblit et al. |
| 6,231,672 B1 | 5/2001 | Choi et al. |
| 6,270,572 B1 | 8/2001 | Kim et al. |
| 6,284,646 B1 | 9/2001 | Leem |
| 6,287,965 B1 | 9/2001 | Kang et al. |
| 6,305,314 B1 | 10/2001 | Sneh et al. |
| 6,306,216 B1 | 10/2001 | Kim et al. |
| 6,342,277 B1 | 1/2002 | Sherman |
| 6,348,376 B2 | 2/2002 | Lim et al. |
| 6,358,629 B1 | 3/2002 | Aga |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,475,910 B1 | 11/2002 | Sneh |
| 6,476,276 B2 | 11/2002 | Matsui et al. |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,488,924 B1 | 12/2002 | Monteleone et al. |
| 6,511,539 B1 | 1/2003 | Raaijmakers |
| 6,551,406 B2 | 4/2003 | Kilpi |
| 6,749,974 B2 | 6/2004 | Chan |
| 7,771,895 B2 | 8/2010 | Wu et al. |
| 9,805,939 B2 * | 10/2017 | Grimbergen ........ H01L 21/3085 |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0007790 A1 | 1/2002 | Park |
| 2002/0009544 A1 | 1/2002 | McFeely et al. |
| 2002/0020869 A1 | 2/2002 | Park et al. |
| 2002/0021544 A1 | 2/2002 | Cho et al. |
| 2002/0031618 A1 | 3/2002 | Sherman |
| 2002/0041931 A1 | 4/2002 | Suntola et al. |
| 2002/0048635 A1 | 4/2002 | Kim et al. |
| 2002/0052097 A1 | 5/2002 | Park |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076837 A1 | 6/2002 | Hujanen et al. |
| 2002/0078508 A1 | 6/2002 | George |
| 2002/0082296 A1 | 6/2002 | Verschoor et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106536 A1 | 8/2002 | Lee et al. |
| 2002/0134307 A1 | 9/2002 | Choi |
| 2002/0144655 A1 | 10/2002 | Chiang et al. |
| 2002/0144857 A1 | 10/2002 | Toyoda |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0197402 A1 | 12/2002 | Chiang et al. |
| 2003/0004723 A1 | 1/2003 | Chihara |
| 2003/0013320 A1 | 1/2003 | Kim et al. |
| 2003/0031807 A1 | 2/2003 | Elers et al. |
| 2003/0042630 A1 | 3/2003 | Babcoke et al. |
| 2003/0049934 A1 | 3/2003 | Buie et al. |
| 2003/0049942 A1 | 3/2003 | Haukka et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0176000 A1 | 9/2003 | Otsubo et al. |
| 2008/0099432 A1 | 5/2008 | Lewington et al. |
| 2008/0261335 A1 * | 10/2008 | Grimbergen ............... C23F 4/00 438/9 |

\* cited by examiner

DUAL ENDPOINT DETECTION FOR ADVANCED PHASE SHIFT AND BINARY PHOTOMASKS

RELATED APPLICATIONS

This application is a continuation of U.S. patent application Ser. No. 13/774,006, filed Feb. 22, 2013, which claims priority to U.S. Provisional Patent Application Ser. No. 61/713,185 filed on Oct. 12, 2012, and U.S. Provisional Patent Application Ser. No. 61/749,156, filed on Jan. 4, 2013, both of which are incorporated by reference in their entireties.

BACKGROUND OF THE INVENTION

Field of the Invention

Embodiments of the present invention generally relate to methods to detect endpoints for both a photoresist layer and an absorber layer in an etching process for the fabrication of photomasks useful in the manufacture of integrated circuits.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

The next generation photomask as further discussed below is formed on a low thermal expansion glass or a quartz substrate having a multilayer film stack disposed thereon. The multilayer film stack may include at least an absorber layer and a photomask shift mask layer. When manufacturing the photomask, a photoresist layer is disposed on the film stack to facilitate transferring features into the film stack during the subsequent patterning processes. During the patterning process, the circuit design is written onto the photomask by exposing portions of the photoresist to extreme ultraviolet light or ultraviolet light, making the exposed portions soluble in a developing solution. The soluble portion of the resist is then removed, allowing the underlying film stack exposed through the remaining photoresist to be etched. The etch process removes the film stack from the photomask at locations where the resist was removed, i.e., the exposed film stack is removed.

During processing, endpoint data from the etching of the film stack for manufacturing photomasks may be used to determine whether the process is operating according to required specifications, and whether the desired results such as etch uniformity and feature critical dimensions are achieved. Since each photomask generally has its own set of features or patterns, different film stacks on the photomask being etched may yield different endpoint data upon different materials being used in the film stack, thereby making it difficult to determine if the desired etch results are obtained for a specific photomask manufacture process. Furthermore, during an etching process, the etching rate for etching the photoresist layer and the film stack for the photomask may be different. Accordingly, when directing a radiation to the photoresist layer and the film stack on the photomask, different thickness variation between the photoresist layer and the film stack may generate different reflective or transmissive signal to the endpoint data, therefore, making it even more difficult to determine an accurate endpoint for both the photoresist layer and the photomask etching process without interfered by the photoresist thickness variation. Thus, an accurate etching process endpoint control to the film stack disposed on the photomask and the photoresist layer thickness remaining on the photomask after the etching process for advanced PSM (phase-shift mask) or EUV technology is highly desirable.

Therefore, there is an ongoing need for improved etching endpoint process control in photomask fabrication, including improved apparatus and methods for collecting etch rate data and determining process endpoints.

SUMMARY OF THE INVENTION

The present invention provides a method and apparatus for etching a photomask substrate with enhanced process monitoring, for example, by providing for optical monitoring at certain regions of the photomask to obtain dual endpoints, e.g., etch rate or thickness loss of both a photoresist layer and an absorber layer. In one embodiment, a method of determining a thickness loss of a photoresist layer during an etching process includes performing an etching process on an absorber layer disposed on a first surface of a substrate through a patterned photoresist layer in a plasma etch chamber, directing radiation having a wavelength greater than 400 nm to an area of the absorber layer covered by the patterned photoresist layer during the etching process, collecting an optical signal transmitted through the area of the absorber layer covered by the patterned photoresist layer, analyzing a waveform obtained from the optical signals at the wavelength greater than 400 nm, and determining a thickness loss of the photoresist layer for etching the photoresist layer based on the transmitted optical signal.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for etching a photomask substrate with enhanced process monitoring, for example, by providing for optical monitoring at certain regions of the photomask to obtain desired etch rate or endpoint determination for both a photoresist layer and an absorber layer disposed on the photomask substrate. Although the discussions and illustrative examples focus on the etching rate detection, thickness loss and process endpoint determination during an etching process of a photoresist layer and an absorber layer disposed on a photomask substrate, various embodiments of the invention can also be adapted for process monitoring of other suitable substrates, including transparent substrates, or dielectric substrates and optical disks. Although the discussions and illustrative examples focus on the etching of a photomask structure, various embodiments of the invention can also be adapted for process monitoring of other suitable substrates, including transparent or dielectric substrates or other semiconductor wafers.

Figure 1:
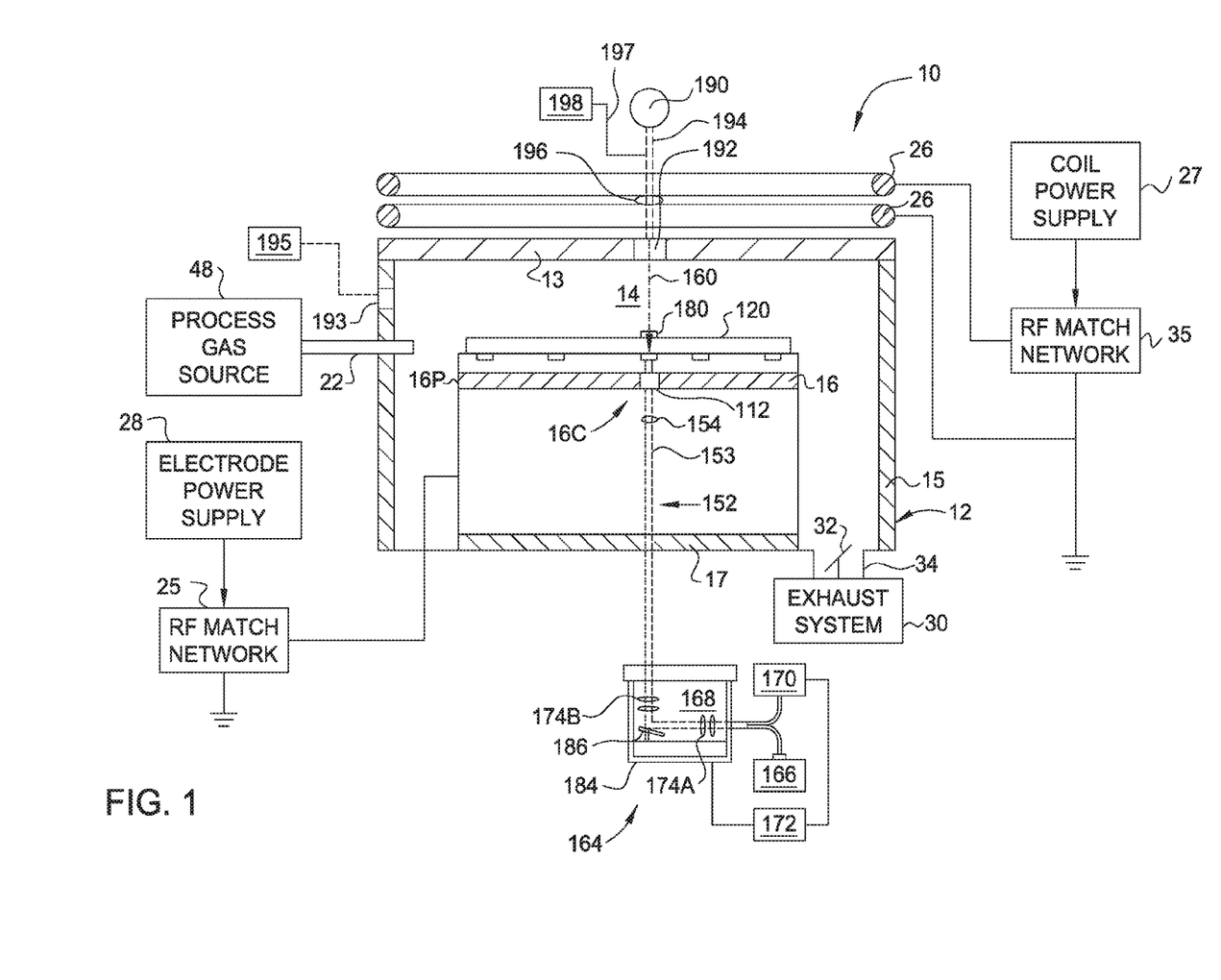
FIG. 1 illustrates a etch chamber incorporating one embodiment of the present invention.

FIG. 1 is a schematic cross sectional view of a plasma etch chamber 10 in accordance with one embodiment of the invention. Suitable plasma etch chambers include the Tetra™ II photomask etch chamber or the Decoupled Plasma Source (DPS™) chamber available from Applied Materials, Inc., of Santa Clara, Calif. Other process chambers may also be used in connection with embodiments of the invention, including, for example, capacitive coupled parallel plate chambers and magnetically enhanced ion etch chambers, as well as inductively coupled plasma etch chambers of different designs. The particular embodiment of the etch chamber 10 shown herein is provided for illustrative purposes and should not be used to limit the scope of the invention. It is contemplated that the invention may be utilized in other processing systems, including those from other manufacturers.

The process chamber 10 generally includes a cylindrical sidewall or chamber body 12, an energy transparent ceiling 13 mounted on the body 12, and a chamber bottom 17. The ceiling 13 may be flat, rectangular, arcuate, conical, dome or multi-radius shaped. At least one inductive coil 26 is disposed above at least a portion of the ceiling 13. In the embodiment depicted in FIG. 1A, two concentric coils 26 are shown. The chamber body 12 and the chamber bottom 17 of the process chamber 10 can be made of a metal, such as anodized aluminum, and the ceiling 13 can be made of an energy transparent material such as a ceramic or other dielectric material.

A substrate support member 16 is disposed in the process chamber 10 to support a substrate 120 during processing. The support member 16 may be a conventional mechanical or electrostatic chuck with at least a portion of the support member 16 being electrically conductive and capable of serving as a process bias cathode. While not shown, a photomask adapter may be used to secure the photomask on the support member 16. The photomask adapter generally includes a lower portion milled to cover an upper portion of the support member and a top portion having an opening that is sized and shaped to hold a photomask. In one embodiment, the top portion of the photomask adapter has a square opening. A suitable photomask adapter is disclosed in U.S. Pat. No. 6,251,217, issued on Jun. 26, 2001, which is incorporated herein by reference to the extent not inconsistent with aspects and claims of the invention.

Process gases are introduced into the process chamber 10 from a process gas source 48 through a gas distributor 22 peripherally disposed about the support member 16. Mass flow controllers (not shown) for each process gas, or alternatively, for mixtures of the process gas, are disposed between the process chamber 10 and the process gas source 48 to regulate the respective flow rates of the process gases.

A plasma zone 14 is defined by the process chamber 10, the substrate support member 16 and the ceiling 13. A plasma is generated in the plasma zone 14 from the process gases by supplying power from a power supply 27 to the inductive coils 26 through an RF match network 35. The support member 16 may include an electrode disposed therein, which is powered by an electrode power supply 28 and generates a capacitive electric field in the process chamber 10 through an RF match network 25. Typically, RF power is applied to the electrode in the support member 16 while the body 12 is electrically grounded. The capacitive electric field, which is transverse to the plane of the support member 16, influences the directionality of charged species to provide more anisotropic etching of the substrate 120.

Process gases and etchant byproducts are exhausted from the process chamber 10 through an exhaust port 34 to an exhaust system 30. The exhaust system 30 may be disposed in the bottom 17 of the process chamber 10 or may be disposed in the body 12 of the process chamber 10 for removal of process gases. A throttle valve 32 is provided in the exhaust port 34 for controlling the pressure in the process chamber 10.

FIG. 1 further illustrates an endpoint detection system 164 operatively coupled to the process chamber 10 in accordance with one embodiment of the invention. According to embodiments of the invention, at least one view port (or called optical access port) is provided in of the substrate support member 16. The optical access port may generally comprise a flat window made of quartz or other materials that transmit light over a broad wavelength spectrum. In the example shown in FIG. 1, the two optical access ports comprise respectively a window at a peripheral region 16P, and a window 112 at a central region 16C. The endpoint detection system 164 is configured to detect optical signals through these windows, which allows optical monitoring of various locations on the photomask substrate 120 from its backside during etching when the detection is in transmission mode. It is noted that different numbers of windows may be provided at other locations of the substrate support member 16.

The endpoint detection system 164 comprises optical setup for operating in reflection or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof.

The optical setup of the endpoint detection system 164 in a reflection mode of operation allows reflectance (or reflectometry) and interferometric measurement to be performed. The endpoint system 164 generally comprises an optical source 166, a focusing assembly 168 for focusing an incident optical beam 176 having at least two wavelengths from the optical source 166 onto an spot or area 180 on the backside of substrate 120, when a reflection mode is used, and a photodetector 170 for measuring the intensity of a return optical beam 153 transmitted through the area 180 of the substrate 120.

Alternatively, an external light source 190 is used for transmittance measurements. For transmission mode, the external light source 190 will be coupled into the chamber 10 through a window 192 provided on the ceiling 13. The use of the external light source 190 for transmittance measurements has an advantage because it can provide a more stable signal, as compared to a plasma source, which may be subjected to fluctuations arising from the etch process. The external light source 190 may be configured to allow monitoring at selected wavelengths that are free from potential interferences from the plasma species. The external light source 190 can be operated in a continuous or pulsed mode to allow for various signal processing options for enhancing endpoint detection capabilities and so on. Details for pulsed source operation with light source 190 are similar to those previously described for source 166. Other embodiments may involve the use of a pulsed or continuous source for both reflection and transmission measurements. In another embodiment, the external light source 190 may be provided through the optical access window 112 in the substrate support member 16, and the transmission signal monitored through the window 192.

As an example of transmission monitoring, output from the light source 190 is coupled via a fiber 194 to pass through the window 192 onto the substrate 120 such as a photomask. Transmitted light (e.g., off a feature on the photomask) is collected by a collimating lens 196 further passing through the substrate 120 to the photodetector 170 disposed in the endpoint detector 164.

The optical setup of the endpoint detection system 164 in a transmission mode of operation may include the light source 190 positioned to direct an optical signal through substrate 120 to the photodetector 170. Optionally, the light source 190 may be the plasma utilized to perform the etch process. Alternatively, the optical source 166 may be positioned below the substrate 120 in reflection mode of operation to direct an optical signal to a backside of the 120 to the photodetector 170 as needed.

The photodetector 170 may be multi-wavelength detector, or a spectrometer. Based on the measured signals of the transmitted optical beam 153, a computer system 172 calculates portions of the real-time waveform and compares it with a stored characteristic waveform pattern to extract information relating to the etch process. In this case, the calculation may be based on slope changes or other characteristic changes in the detected signals, either in reflection or transmission mode, for example, when a film is etched through. Alternatively, the calculation may be based on interferometric signals as the depth of a trench or the thickness of a film changes during etching. In other embodiments, more detailed calculations may be performed based on reflection and transmission data obtained over a wide spectrum in order to determine the depth or thickness at any point in the etch process, or to determine the lateral dimensions of the features being etched.

The light source 190 provides a signal having certain range including at least first wavelength and a second wavelength. The first and second wavelengths are selected such that a signal characteristic of the first wavelength interfacing with a photoresist layer is the inverse of a signal characteristic of the second wavelength interfacing with the absorber layer. The signal characteristic may be intensity or polarization as needed. The inverse characteristic is utilized to cancel out the effect or interference with the signal interfacing with the absorber layer to leave a resultant signal primarily composed of the portion of the optical signal interfaced with a target being etch, such as the absorber layer disposed on the substrate 120. As the resultant signal has less noise, a more precise and accurate determination of an etch endpoint or thickness of the target material may be realized. In one configuration, the second wavelength is selected to have a wavelength about or equal to twice the wavelength of the first wavelength. In one embodiment, the first wavelength is configured to be around 200 nm and about 400 nm, such as between about 230 nm and about 350 nm. The second wavelength is configured to be around 400 nm and about 800 nm.

The light source 190 (which may be include multiple individual light sources), may be polychromatic, white light, or other light source suitable for providing light in the at least first and second wavelengths. In general, the optical signal from the transmitted beam 153 may be analyzed to extract information regarding the presence or absence of layers (e.g., the photoresist layer or the absorber layer, such as a metal-containing layer), or the thickness of certain material layers within the area 180. The intensity of the incident light beam 160 is selected to be sufficiently high to provide the transmitted beam 153 with a measurable intensity. The lamp can also be switched on and off to subtract background light such as from the plasma. In one embodiment, the light source 190 (or the light source 166) provides polychromatic light, e.g., from an Hg—Cd lamp or a light emitting diode (LED), which generates light in a wavelength range from about 200 nm to about 800 nm. The transmitted beam 153 can be analyzed by a spectrometer (array detector with a wavelength-dispersive element) to provide data over a wide wavelength range, such as ultraviolet to visible, from about 200 nm to 800 nm. The light source 190 (or the light source 166) can also comprise a flash lamp, e.g., a Xe or other halogen lamp, or a monochromatic light source that provides optical emission at selected wavelengths, for example, a He—Ne or ND-YAG laser.

Optionally, a light beam positioner 184 may be used to move the incident light beam 176 across the substrate 120 to locate a suitable portion of the substrate surface on which to position the beam spot 180 to monitor an etching process. The light beam positioner 284 may include one or more primary mirrors 186 that rotate at small angles to deflect the light beam from the light source 166 onto different positions of the substrate surface. The photodetector 170 comprises a light-sensitive electronic component, such as a photovoltaic cell, photodiode, or phototransistor, which provides a signal in response to a measured intensity of the transmitted light beam 153. The signal can be in the form of a change in the level of a current passing through an electrical component or a change in a voltage applied across an electrical component. The photodetector 170 can also comprise a spectrometer (array detector with a wavelength-dispersive element) to provide data over a wide wavelength range, such as ultra-violet to visible, from about 200 nm to 800 nm. The transmitted light beam 153 undergoes constructive and/or destructive interference which increases or decreases the intensity of the light beam, and the photodetector 170 provides an electrical output signal in relation to the measured intensity of the transmitted light beam 153. The electrical output signal is plotted as a function of time to provide a spectrum having numerous waveform patterns corresponding to the varying intensity of the transmitted light beam 153.

A computer program executed on a computer system 172 compares the shape of the measured waveform pattern of the transmitted light beam 153 to a stored characteristic (or reference) waveform pattern and determines the endpoint of the etching process when the measured waveform pattern is the same as the characteristic waveform pattern. As such, the period of the interference signal may be used to calculate the depth and etch rate. The program may also operate on the measured waveform to detect a characteristic waveform, such as, an inflection point. The operations can be simple mathematic operations, such as evaluating a moving derivative to detect an inflection point.

The computer program utilizes the inverse characteristic of the signal interfacing with the photoresist to remove or cancel out the contribution of the signal interfacing with the photoresist, thus allowing the signal interfacing with the target layer being etched to be more accurately analyzed to determine the endpoint of the etched target layer.

The endpoint detection system 164 comprises optical setup for operating in at least one of reflection, interferometry or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof. In one particular embodiment depicted therein, the endpoint detection system 164 is configured to detect a process endpoint based on a change in the transmittance transmitted through an etched substrate surface.

Figure 2:
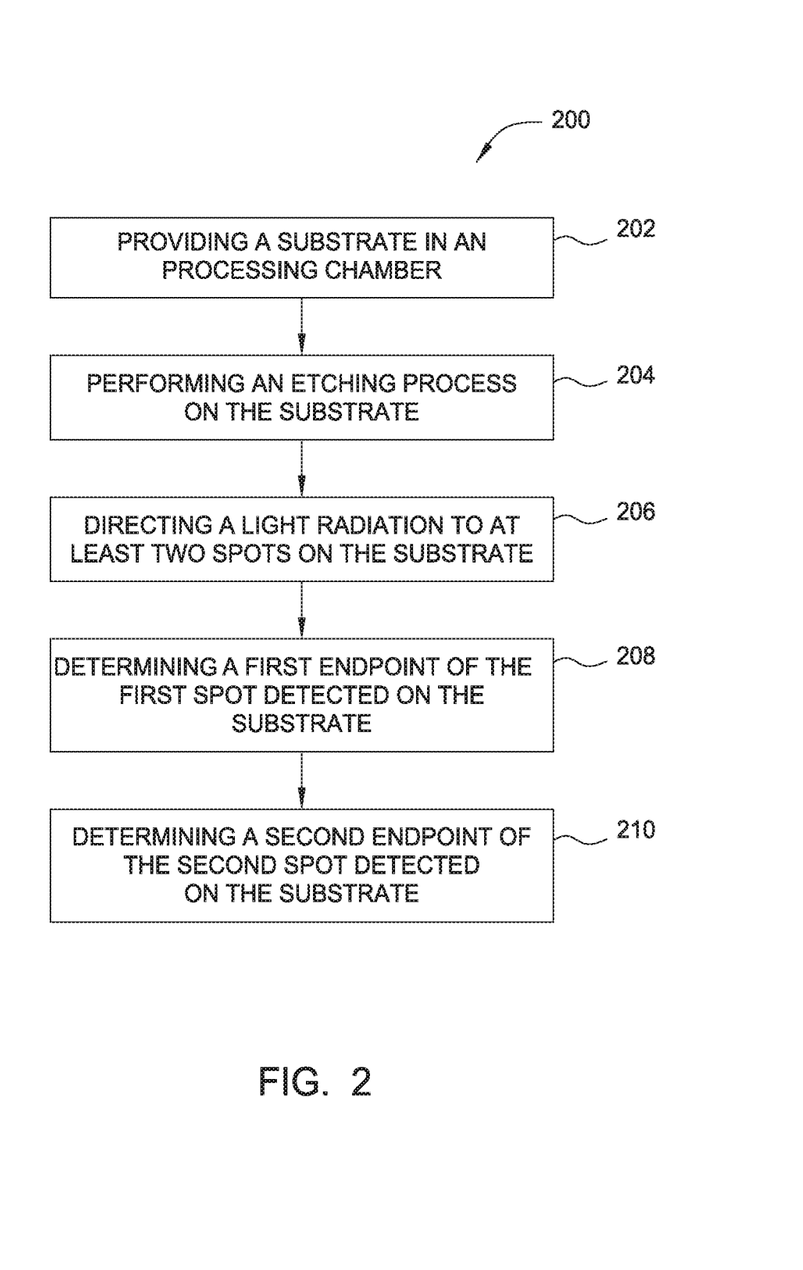
FIG. 2 illustrates a flow diagram regarding an endpoint determination process during fabrication process in accordance with one embodiment of the present invention.
Figure 3A:
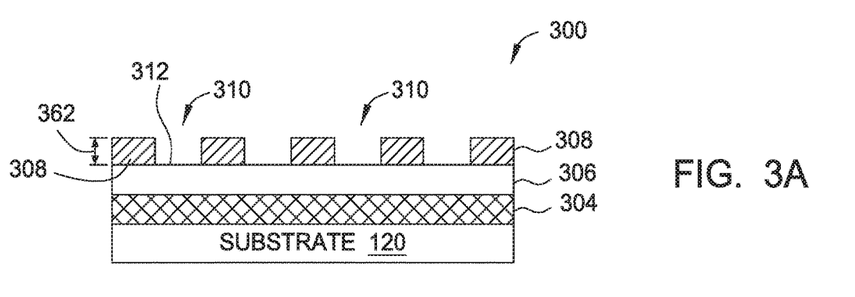
FIGS. 3A-3C illustrate schematically structures of one embodiment of the photomasks during fabrication.

FIG. 2 is a flow diagram of one embodiment of a method 200 for etching an absorber layer formed in a film stack having a patterned photoresist layer disposed thereon on a photomask substrate, such as an absorber layer 306 formed in a film stack 300 having a patterned photoresist layer 308 disposed on a photomask substrate 120 depicted in FIG. 3A. Dual endpoints may be determined for an etching process for etching both the photoresist layer 308 and the absorber layer 306. The etching process performed to etch the film stack 300 may be monitored by different etch rate detection techniques of the present invention. The film stack 300 disposed on the photomask substrate 120 that may be utilized to form desired features (i.e., openings 310) in the film stack 300. Although the method 200 is described below with reference to a substrate utilized to fabricate a photomask, the method 200 may also be used to advantage in other photomask etching or any etching application.

The method 200 begins at block 202 when the photomask substrate 120 is transferred to and placed on a substrate support member disposed in an etch reactor, such as the etching chamber depicted in FIG. 1. As described above, the photomask substrate 120 includes an optically transparent silicon based material, such as quartz or low thermal expansion glass layer having the absorber layer 306 disposed thereon defined by the patterned photoresist layer 308 having portions 312 of the absorber layer 306 exposed by the patterned photoresist layer 308 readily for etching. In one embodiment, a phase shift mask layer 304 may be disposed between the substrate 120 and the absorber layer 306.

In one embodiment, the photomask substrate 120 has a rectangular shape having sides between about 5 inches to about 9 inches in length. The photomask substrate 120 may be between about 0.15 inches and about 0.25 inches thick. In one embodiment, the photomask substrate 120 is about 0.25 inches thick. The absorber layer 306 may be a metal containing layer, e.g., a chromium containing layer, such as a Cr metal, chromium oxide ($CrO_x$), chromium nitride (CrN) layer, chromium oxynitride (CrON), or multilayer with these materials, as needed. The phase shift mask layer 304 may be a molybdenum containing layer, such as Mo layer, MoSi layer, MoSiN, MoSiON, and the like. The patterned photoresist layer 308 is then formed over the absorber layer 306 having openings 310 formed therein that expose portions 312 of the absorber layer 306 for etching. The photoresist layer 308 may have an initial thickness 362 and comprise any suitable photosensitive resist materials, such as an e-beam resist (for example, a chemically amplified resist (CAR)), and deposited and patterned in any suitable manner. The photoresist layer may be deposited to a thickness between about 100 nm and about 1000 nm.

At block 204, an etching process is performed to etch the absorber layer 306 disposed on the substrate 120. The patterned photoresist layer 308 may serve as a mask layer to protect some portion of the absorber layer 306 from being etched during the absorber layer etching process. The etching process endpoint detection for etching the absorber layer 306 can be monitored either in reflection or transmission mode, and reflectance, transmittance and/or interferometric signals can be performed. In one particular embodiment depicted therein, the process endpoint detection for etching the absorber layer 306 is monitored in transmission mode.

Figure 3B:
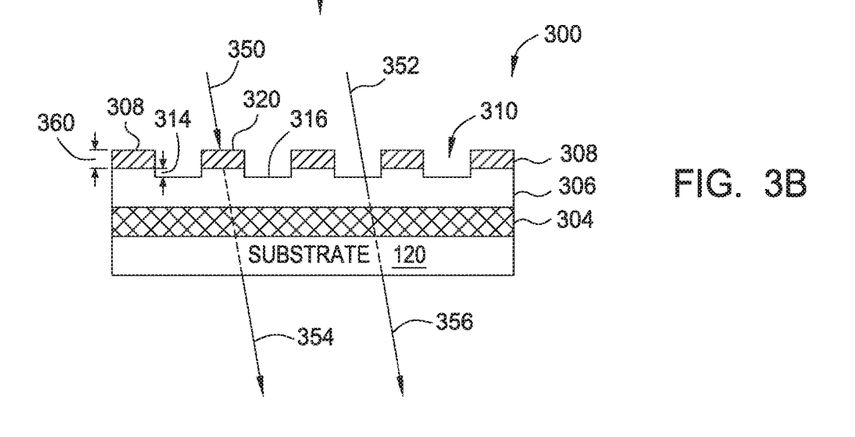

In one embodiment, halogen-containing gases are used for etching different materials found on the film stack 200 of the photomask structure. For example, a process gas containing chlorine may be used for etching an absorber layer (e.g., a chromium containing layer). Alternatively, a fluorine-containing gas such as trifluoromethane ($CHF_3$) or tetrafluoromethane ($CF_4$) may also be used during etching of the absorber layer 306. A plasma is generated from the process gas to perform the etching process until the underlying surface of the phase shift mask layer 304 is exposed. FIG. 3B depicts an embodiment wherein a portion 314 of the absorber layer 306 has been etched away from the substrate 120 in the middle of the etching process after performing the etching process for a period of time.

At block 206, while etching the absorber layer 306, an incident optical beam 350, 352 from the endpoint detection system 164 or the light source 190 is directed to the etched substrate surface. The incident optical beam 350, 352 may have a wavelength between about 170 nm to about 800 nm. The incident optical beam 350, 352, as shown in FIG. 3B, from the light source 190 is directed, through one of the windows in the chamber lid, onto one or more areas of the photomask substrate 120. The incident optical beam 350, 352 is directed to different locations of the substrate with different materials, such as on a surface 320 of the photoresist layer 308 and the exposed portion 316 of the absorber layer 306. The incident optical beam 350, 352 is directed to the opening 310, such as open areas where the absorber layer 306 is exposed by the patterned photoresist layer 308 to be etched to form trenches, vias, and apertures for the film stack 300, and also to the surface 320 of the photoresist layer 308. Different transmission signal may be obtained. By analyzing different signals as obtained, dual etching endpoints may be obtained. Alternatively, the plasma itself may be used as the light source.

A return beam 354, 356, e.g., transmitted through the surface 320 of the photoreisst layer 308 and the etched absorber layer 306 within the openings 310 being etched and exposed, is detected to the photodetector 170 of the etch rate detection system 164. During etching of the absorber layer 306, as well as consumption of the photoresist layer 308 during etching, the intensity of the transmitted optical beam 354, 356 changes overtime. The time-varying intensity of the transmitted optical beam 354, 356 at particular wavelengths is then analyzed to determine at least one of the depth etched, the etch rate and the end point of the absorber layer etching process.

Figure 3C:
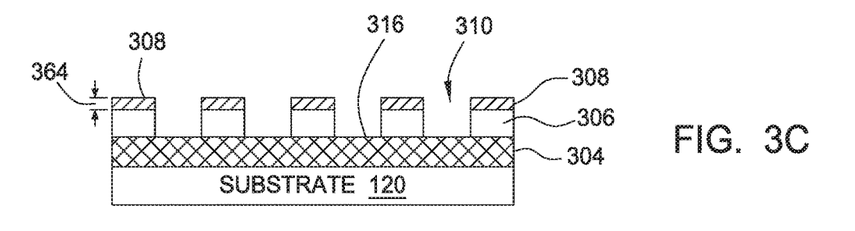
Figure 4:
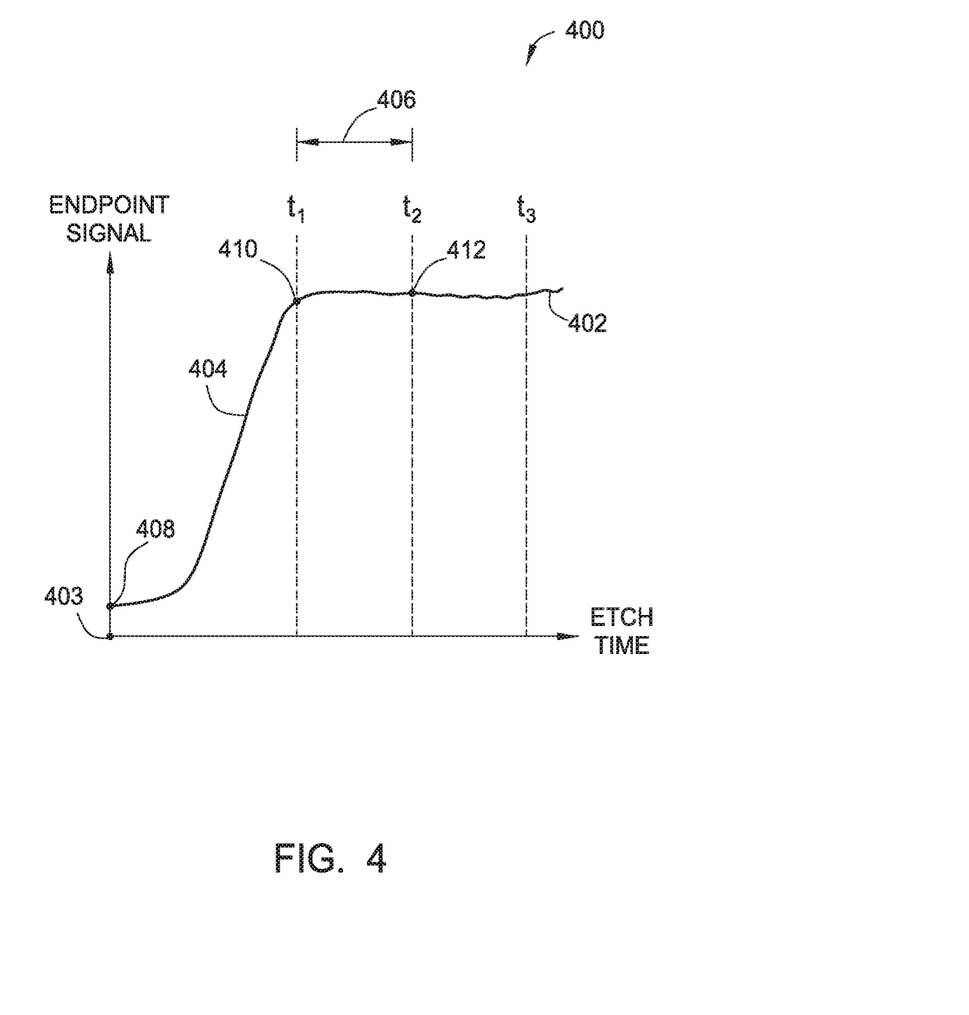
FIG. 4 illustrates one embodiment of optical signals detected for etch rate determination for etching an absorber layer.

At block 208, a first etching process endpoint is determined by analyzing the waveform obtained from the detected transmitted optical beam 356 transmitted from a surface 316 of the etched substrate when the absorbed layer 306 exposed by the patterned photoresist layer 308 is removed from the substrate 102, as shown in FIG. 3C. The optical signals as detected from the transmitted beam 354, 356 is utilized for both of the etch rate determination for etching the absorber layer 306 and the thickness loss of the photoresist layer 308. In one embodiment, the wavelength of the optical beam 354, 356 is controlled at a light wavelength at between about 200 nm and about 800 nm from the light source 190. An optical signal 402, as shown in FIG. 4, is plotted as a function of time to provide a waveform pattern corresponding to the varying intensity of the transmitted optical beam 356 over time transmitted through the absorber layer 306 without interference with the photoresist layer 308. The waveform pattern will be different at other wavelengths. Collecting a spectrum of wavelengths will provide numerous waveform patterns. The optical signal 402 is detected real-time when the absorber layer 306 is etched in the etch reactor. In the embodiment depicted in FIG. 4, the intensity of the transmitted beam 356 is gradually increasing at a slope 404 as the underlying phase shift mask layer 304 is gradually exposing. When the absorber layer 306 is gradually etched away, the intensity of the transmitted optical beam 356 gradually increases until becoming saturated at a situated intensity 410. When the intensity of the optical signal 402 is saturated and at a steady state for a time period 406, it indicates the absorber layer 306 has been etched away, exposing the underlying phase shift mask layer 304, thereby determining a time point 412 as the proper endpoint for etching away the absorber layer 306.

In one embodiment, an endpoint for etching the absorber layer 306 may be determined when the intensity of the transmitted optical beam 356 as detected is between about 60 percent and about 95 percent, such as between about 70 percent to 90 percent, more than an initial detected transmitted optical beam intensity 408 collected in a beginning time point 403 of the detection process (e.g., from intensity 408 to intensity 410). In another embodiment, the endpoint for etching the absorber layer 306 may be determined when the slope of the optical signal 402 increases at least two times of its initial amount. In other word, the endpoint for etching the absorber layer 306 is determined when a change in slope is about greater than about 50 percent of the original detected slope. In yet another embodiment, the endpoint for etching the absorber layer 306 may be determined when the optical signal 402 has become saturated and remains in a steady state for at least about a time period 406, such as greater than 3 seconds. In an exemplary embodiment wherein a light source is between about 200 nm and about 400 nm, such as between about 230 nm and about 350 nm, for example about 230 nm, wavelength is utilized to detect the endpoint for etching the absorber layer 306, the process endpoint occurred at time point 412 is between about 5 seconds and about 600 seconds.

Figure 5A:
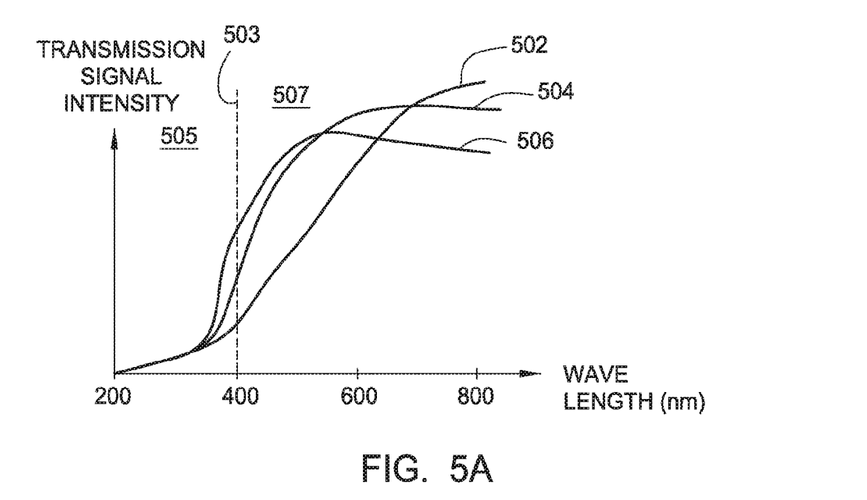
FIGS. 5A-5B illustrate one embodiment of optical signals detected for etch rate determination for etching a phtoresist layer.
Figure 5B:
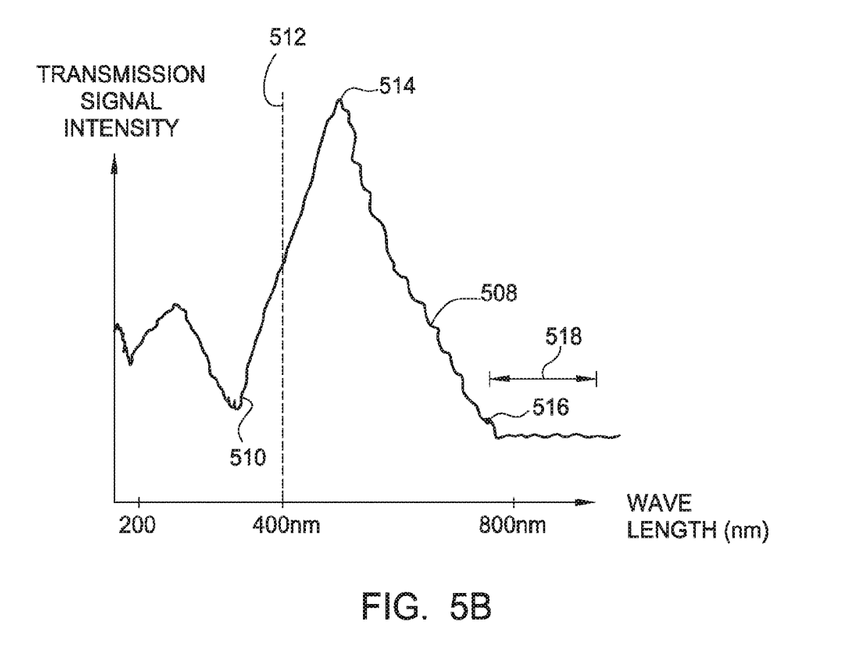

At block 210, after the first end point for etching the absorber layer 306 is determined, a second end point for the etching photoresist layer 308 may be subsequently determined by analyzing a spectrum 508 obtained from the transmitted light beam 354 transmitted through the photoresist layer 308, as shown in FIG. 5B.

Referring first to FIG. 5A, different waveforms may be obtained at different photoresist layer thickness during different stages of the absorber layer etching process. A first waveform 502 is obtained at initial stage of the etching process of the absorber layer 306 so that most of the bulk photoresist layer thickness, such as the thickness 362 depicted in FIG. 3A, of the photoresist layer 308 is still present on the substrate 120. A second waveform 504 is obtained during etching of the photoresist layer 308 after a portion of the photoresist layer 308 is consumed, leaving the remaining thickness 360 depicted in FIG. 3B, during the etching process of the absorber layer 306. A third waveform 506 is obtained during etching of the photoresist layer 308 after most of the photoresist layer 308 has been consumed, leaving the remaining thickness 364 depicted in FIG. 3C, after the etching process of the absorber layer 306. As shown in FIG. 5A, the first, second and the third waveforms 502, 504 and 506 are mostly overlapped at a short wavelength range less than 400 nm, as indicated in a short wavelength region 505 defined by the dotted line 503. At a wavelength greater than 400 nm, the first, second and third waveforms 502, 504, 506, have their own unique signal intensity behaviors, as indicated in a long wavelength region 507 defined by the dotted line 503. For example, at a wavelength greater than 400 nm in the long wavelength region 507, the signal intensities of the first, second and third waveforms 502, 504, 506 are distinguishably different from each other and have their own specific intensities that represent different detected photoresist layer thickness. Accordingly, by using a light source with specific wavelength range, such as greater than 400 nm, different thickness of the photoresist layer 308 remaining on the substrate 120 may be determined. In one embodiment, a light source with wavelength in long wavelength range, such as greater than 400 nm, is utilized to detect an endpoint (or thickness loss) of the photoresist layer 308.

FIG. 5B depicted an optical signal 508 indicating the signal intensity change of the transmitted light source 354 transmitting through the photoresist layer 308 during the etching process. The downturn 510 of the optical signal 508 at a wavelength less than 400 nm, indicated by the dotted line 512, indicates that the photoresist layer 308 at this wavelength range is not substantially transparent. Thus, an absorber layer etching endpoint may not be easily determined using the signal change for less than 400 nm wavelength signals. As the optical signal 508 transitions to a longer wavelength range, e.g., greater than 400 nm wavelength, a distinct peak 514 may be observed. This peak 514 shifts in wavelength as the thickness of the photoresist layer 308 is gradually consumed and etched away. At individual wavelengths, the signal 508 increases or decreases as the photoresist layer becomes thinner. After the optical signal 508 has reached to a certain value 516, an endpoint of the photoresist layer etching/thickness loss/thickness consumption process may be determined. Alternatively, the remaining thickness of the photoresist layer 308 on the substrate 120 may be determined based on the signal intensity of the optical signal 508 versus wavelength as detected. Alternatively, the endpoint may be obtained by time mode based on the etch rate detected. After a predetermined processing time is reached, the desired depth of the feature etched in the quartz substrate is reached.

Accordingly, dual endpoints of etching the photoresist layer 308 and the absorber layer 306 may both be obtained during one etching process by using one light beam radiation with broad range of wavelength. Subsequently, the dual endpoint detection process may be determined by splitting the analyzing process into two analyzing step process so as to analyze waveforms in two different wavelength ranges to determine the endpoints for each of the photoresist layer 308 and the absorber layer 306.

In one embodiment, an endpoint for etching the photoresist layer 308 may be determined when the intensity of the transmitted optical beam 356 as detected is between about 50 percent and about 90 percent, such as between about 60 percent and 80 percent, below the peak 514 of the intensity of the optical signal 508 collected during etching, as shown in FIG. 5B. In yet another embodiment, the endpoint for etching the photoresist layer 308 may be determined when the optical signal 508 has become saturated and remains in a steady state condition exceeding a predetermined period of time 518, such as greater than 3 seconds. In an exemplary embodiment wherein a light source is between about 400 nm and about 800 nm, such as about 450 nm wavelength, is utilized to detect the endpoint for etching the photoresist layer 308, the process endpoint may be selected as a time period is between about 5 seconds and about 600 seconds.

By monitoring transmissivity of an optical beam transmitted through areas having photoresist layer and etched absorber layer at two different predetermined wavelengths, dual process endpoints may be obtained by a signal optical detection. By analyzing waveforms obtained from the transmitted optical beam transmitted through an etched substrate surface at different wavelengths at different etching stage, dual process endpoints for both the photoresist layer etching and the absorber layer etching may be obtained. These improvements also allow reliable etch rate/loss of thickness and endpoint determination for phtoresist layer and absorber layer etching applications.

While the foregoing is directed to embodiments of the present invention, other and further embodiments of the invention may be devised without departing from the basic scope thereof, and the scope thereof is determined by the claims that follow.

The invention claimed is:

1. A method of determining a thickness loss of a photoresist layer during an etching process, comprising:
    performing an etching process on an absorber layer disposed on a first surface of a substrate through a patterned photoresist layer in a plasma etch chamber;
    directing radiation having at least two wavelengths greater than 400 nm to a first area of the absorber layer covered by the patterned photoresist layer and a second area of the absorber layer uncovered by the patterned photoresist layer during the etching process;
    collecting an optical signal transmitted through the first area of the absorber layer covered by the patterned photoresist layer;
    analyzing a waveform obtained from the optical signals at the wavelengths greater than 400 nm;
    determining a thickness loss of the photoresist layer for etching the photoresist layer based on the transmitted optical signal; and
    determining dual endpoints for etching the absorber layer and the photoresist layer in response to the optical signal becoming substantially horizontally flat.

2. The method of claim 1, wherein the substrate is a photomask reticle.

3. The method of claim 1, wherein analyzing the waveform further comprises:
    analyzing a waveform as a function of time verses intensity at the wavelengths greater than 400 nm.

4. The method of claim 1, wherein the absorber layer is a Cr containing layer.

5. The method of claim 1, further comprising:
    determining an endpoint for etching the photoresist layer in response to the optical signal becoming substantially horizontally flat.

6. The method of claim 1, wherein the photoresist layer has a thickness between about 100 nm and about 1000 nm.

7. The method of claim 1, wherein the wavelengths are between about 400 nm and about 800 nm.

8. The method of claim 1, further comprising:
    determining an endpoint for etching the photoresist layer in response to a signal intensity of the optical signal reaching to a peak value.

9. The method of claim 8, wherein the endpoint is reached when the signal intensity is between about 50 percent and about 90 percent below a peak of the signal intensity of the optical signal.

10. The method of claim 8, wherein the endpoint is reached when the signal intensity remains in a steady state condition.

* * * * *